United States Patent
Ikegawa et al.

(10) Patent No.: US 9,252,043 B2
(45) Date of Patent: Feb. 2, 2016

(54) FILM DEPOSITION METHOD

(71) Applicant: Tokyo Electron Limited, Tokyo (JP)

(72) Inventors: Hiroaki Ikegawa, Iwate (JP); Masahiko Kaminishi, Iwate (JP); Jun Ogawa, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/937,070

(22) Filed: Jul. 8, 2013

(65) Prior Publication Data

US 2014/0011353 A1 Jan. 9, 2014

(30) Foreign Application Priority Data

Jul. 9, 2012 (JP) ................. 2012-153407

(51) Int. Cl.
*H01L 21/02* (2006.01)
*H01L 21/76* (2006.01)
*H01L 21/677* (2006.01)
*H01L 21/687* (2006.01)
*C23C 16/40* (2006.01)
*C23C 16/455* (2006.01)

(52) U.S. Cl.
CPC ............... *H01L 21/76* (2013.01); *C23C 16/40* (2013.01); *C23C 16/45531* (2013.01); *H01L 21/0228* (2013.01); *H01L 21/02178* (2013.01); *H01L 21/02189* (2013.01); *H01L 21/02194* (2013.01); *H01L 21/02274* (2013.01); *H01L 21/67748* (2013.01); *H01L 21/68764* (2013.01); *H01L 21/68771* (2013.01)

(58) Field of Classification Search
CPC ............... H01L 21/02178; H01L 21/02189; H01L 21/0228; H01L 21/31616; H01L 21/31641
See application file for complete search history.

(56) References Cited

U.S. PATENT DOCUMENTS

2010/0320520 A1  12/2010  Nakagawa et al.
2012/0149193 A1*  6/2012  Fujiwara ................. 438/675
2013/0122720 A1*  5/2013  Takebayashi et al. ...... 438/763

FOREIGN PATENT DOCUMENTS

JP   2011-018707   1/2011
JP   2012-069871   4/2012
WO  WO 2008/108128  9/2008

* cited by examiner

*Primary Examiner* — Pamela E Perkins
(74) *Attorney, Agent, or Firm* — IPUSA, PLLC

(57) ABSTRACT

A film deposition method is provided. A first metal compound film is deposited by performing a first cycle of exposing a substrate to a first source gas containing a first metal, and of exposing the substrate to a reaction gas reactive with the first source gas. Next, the first source gas is adsorbed on the first metal compound film by exposing the substrate having the first metal compound film deposited thereon to the first source gas. Then, a second metal compound film is deposited on the substrate by performing a second cycle of exposing the substrate having the first source gas adsorbed thereon to a second source gas containing a second metal, and of exposing the substrate to the reaction gas reactive with the second source gas.

8 Claims, 7 Drawing Sheets

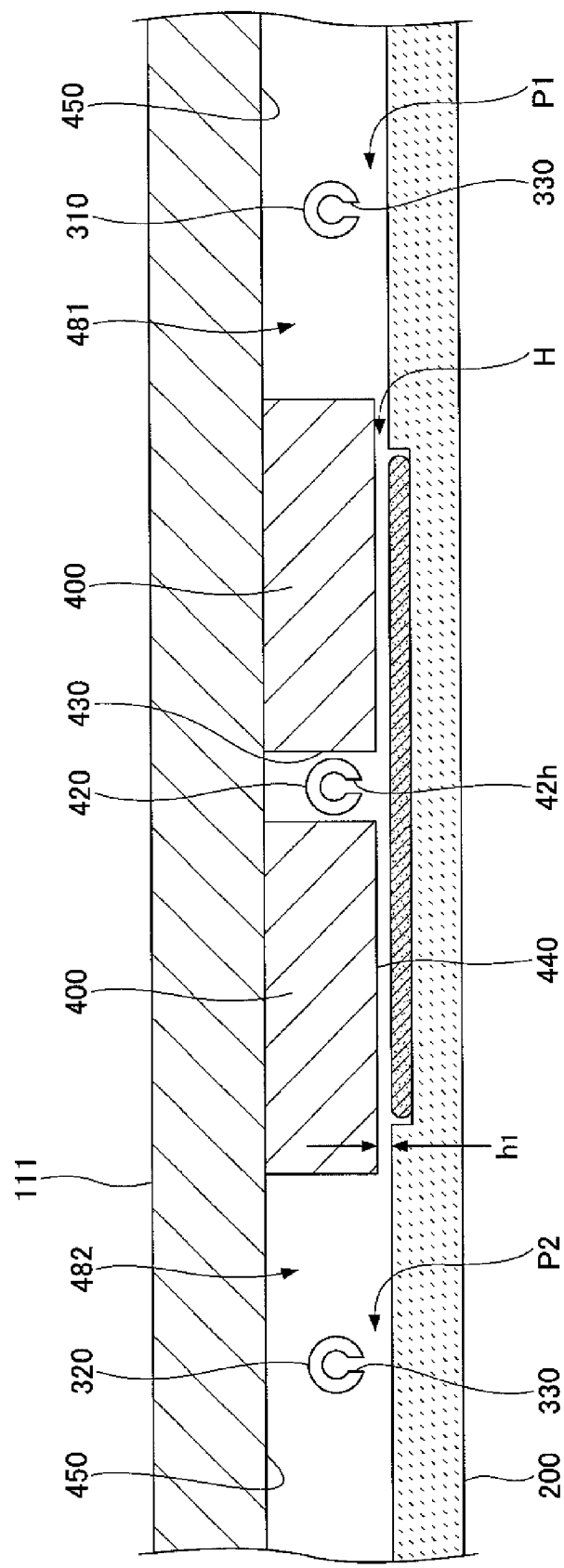

FILM DEPOSITION METHOD

CROSS-REFERENCE TO RELATED APPLICATIONS

This patent application is based upon and claims the benefit of priority of Japanese Patent Application No. 2012-153407, filed on Jul. 9, 2012, the entire contents of which are incorporated herein by reference.

BACKGROUND OF THE INVENTION

1. Field of the Invention

The present invention relates to a film deposition method that deposits a thin film made of a reactive product by alternately exposing a substrate such as a semiconductor wafer to two or more kinds of reaction gases that react with each other.

2. Description of the Related Art

In recent years, high dielectric constant materials have been gradually used as an insulating layer of a memory cell in a semiconductor memory device. Among such materials, there is a zirconium oxide (ZrO). While the ZrO has a dielectric constant from about 24 to 40, there is a problem of having low voltage endurance. Therefore, as disclosed in International Publication No. 2008/108128 and Japanese Laid-open Patent Application Publication No. 2011-18707, using a ZrAlO film obtained by adding aluminum (Al) to the ZrO is tried to implement a high dielectric constant and high voltage endurance.

A film deposition method called an atomic layer deposition (ALD) method or molecular layer deposition (MLD) method is expected as a method of depositing the ZrAlO film, which is a ternary metallic oxide. According to the film deposition method, by repeating a ZrO cycle of depositing a ZrO film by alternately supplying a Zr-containing gas and an oxygen-containing gas to a substrate a plurality of times, and an AlO cycle of depositing an AlO film by alternately supplying an Al-containing gas and an oxygen-containing gas to a substrate a plurality of times, the ZrAlO film in which the ZrO film and the AlO film are alternately deposited can be deposited. In this case, composition of Al relative to Zr is determined by a ratio of an Al layer to a Zr layer. More specifically, the dielectric constant and the withstand voltage of the ZrAlO film are controlled by a ratio of the number of the Zr layer in the ZrO film deposited by the ZrO cycle to the number of the Al layer in the AlO film deposited by the AlO cycle.

As described above, in a case of controlling an Al composition (i.e., Al additive amount) by a layer number ratio of the Zr layer and the Al layer, the Al additive amount may not be controlled freely. For example, when the ZrAlO film contains four Zr layers in the ZrO film and one Al layer in the AlO film, a $Zr_{0.8}Al_{0.2}O$ film is substantially deposited, and a $Zr_{0.9}Al_{0.1}O$ film cannot be obtained. On the other hand, if nine Zr layers and one Al layer are provided in the ZrAlO film to deposit the $Zr_{0.9}Al_{0.1}O$ film, a total film thickness of the ZrO film and the AlO film is forced to be thick, and so a thin ZrAlO film cannot be obtained according to conditions.

SUMMARY OF TEE INVENTION

Embodiments of the present invention provide a novel and useful film deposition method solving one or more of the problems discussed above.

More specifically, according to one embodiment of the present invention, there is provided a film deposition method of depositing an atomic layer (a molecular layer) that can improve composition controllability of a ternary metallic oxide.

According to one embodiment of the present invention, there is provided a film deposition method that includes the following steps. First, a first metal compound film is deposited by performing a first cycle of exposing a substrate to a first source gas containing a first metal, and of exposing the substrate to a reaction gas reactive with the first source gas. Next, the first source gas is adsorbed on the first metal compound film by exposing the substrate having the first metal compound film deposited thereon to the first source gas. Then, a second metal compound film is deposited on the substrate by performing a second cycle of exposing the substrate having the first source gas adsorbed thereon to a second source gas containing a second metal, and of exposing the substrate to the reaction gas reactive with the second source gas.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 7 is a partial cross-sectional view illustrating the film deposition apparatus in FIG. 4.

DETAILED DESCRIPTION OF THE PREFERRED EMBODIMENTS

Figure 1:
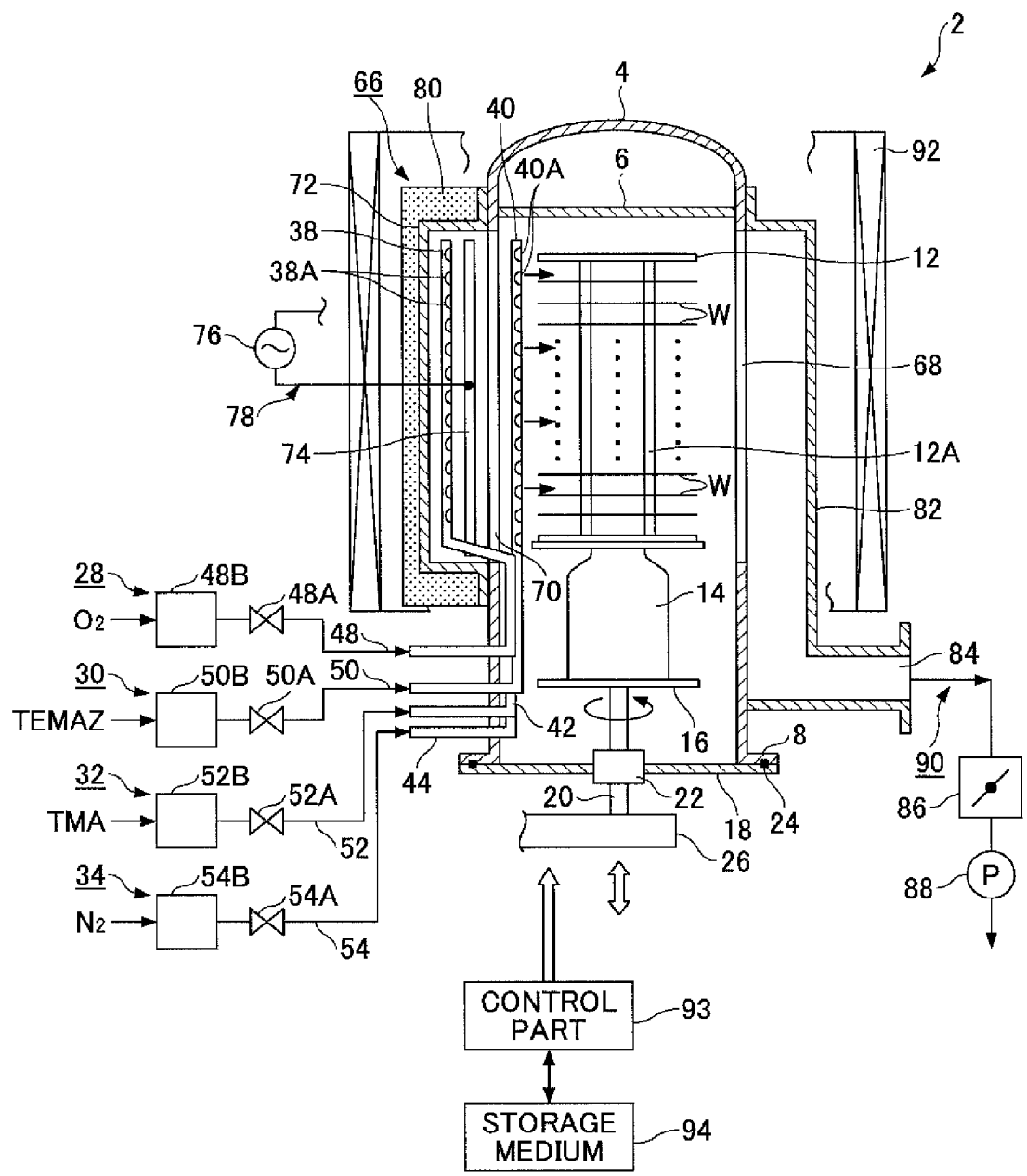
FIG. 1 is a cross-sectional view illustrating a film deposition apparatus preferable to implement a film deposition method of an embodiment of the present invention.

A description is given below, with reference to accompanying drawings of non-limiting, exemplary embodiments of the present invention. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

<Film Deposition Apparatus>

A description is given below, with reference to FIGS. 1 and 2, of a preferred film deposition apparatus to implement a film deposition method of an embodiment of the present invention.

Figure 2:
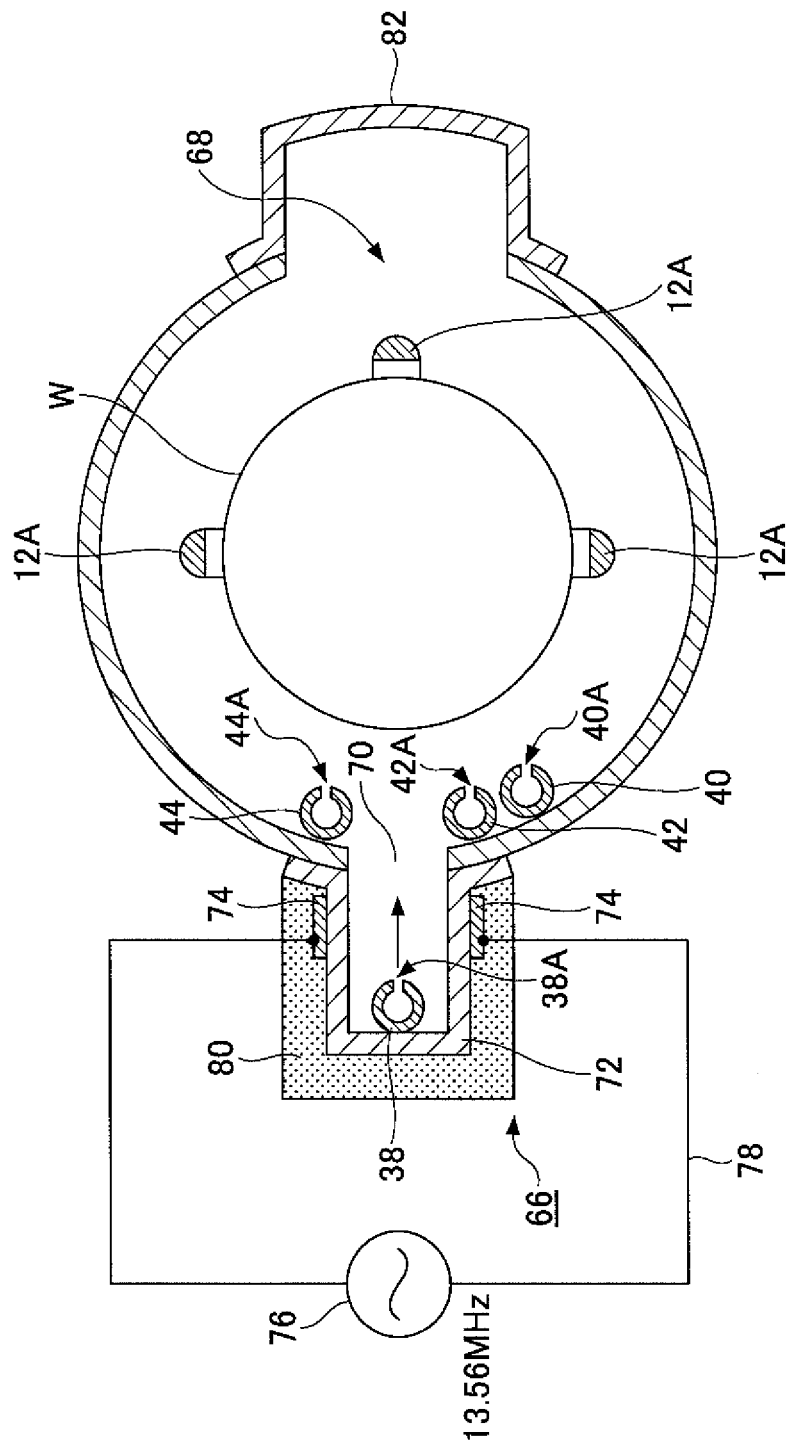
FIG. 2 is a schematic top view of the film deposition apparatus in FIG. 1.

With reference to FIGS. 1 and 2, the film deposition apparatus 2 includes a process chamber 4 having a cylindrical shape with the ceiling and whose lower end is open. The whole of the process chamber 4 is, for example, made of quartz, and the ceiling of the process chamber 4 includes a ceiling plate 6 made of quartz, which seals the process chamber 4. The process chamber 4 includes a flange part 8 at the lower end opening portion. Here, a manifold made of stainless steel may be provided at the lower end of the process chamber 4.

A wafer boat 12 made of quartz in which semiconductor wafers W are loaded on a plurality of steps is carried into and out of the process chamber 4 through the lower end opening portion of the process chamber 4. In the present embodiment, grooves (which are not shown in the drawings) to support, for example, fifty to one hundred wafers W with a diameter of 300 mm, at about the same pitch, are formed in support pillars 12A.

The wafer boat 12 is loaded on a table 16 through a heat-retention cylinder 14, and the table 16 is supported on a rotational shaft 20 penetrating a cover part 18 that is, for example, made of stainless steel and opens and closes the lower end opening portion of the process chamber 4.

For example, a magnetic fluid seal 22 is provided at the penetrating portion of the rotational shaft 20, and supports the rotational shaft 20 hermetically and rotatably. Moreover, a sealing member 24, for example, made of an O-ring is provided between a peripheral part and the lower end portion of the process chamber 4, and isolates the inside of the process chamber 4 from the outer atmosphere.

The rotational shaft 20 is, for example, attached to the tip of an arm 26 supported by, for example, a lifting mechanism (which is not shown in the drawing) such as a boat elevator, and can carry the wafer boat 12, the cover part 18 and the like integrally into and out of the process chamber 4. Here, by fixing the table 16 to the cover part 18, the wafer boat 12 may be configured to be unrotatable.

In a lower part of the process chamber 4, a gas supply part 28 to supply, for example, an oxygen ($O_2$) gas, a gas supply part 30 to supply, for example, a tetrakis(ethylmethylamino) zirconium (TEMAZ) gas, a gas supply part 32 to supply, for example, a trimethylaluminum (TMA) gas and a purge gas supply part 34 to supply an inactive gas (e.g., an $N_2$ gas) as a purge gas are provided.

More specifically, the gas supply part 28 includes a gas dispersion nozzle 38 made of quartz glass that penetrates a lower part of a side wall of the process chamber 4 inward, is bent, and extends upward. The gas dispersion nozzle 38 includes a plurality of gas ejection holes 38A (also see FIG. 2) formed along the lengthwise direction at predetermined intervals, and the plurality of gas ejection holes 38A approximately uniformly ejects an $O_2$ gas in a horizontal direction.

Similarly, the gas supply part 30 includes a gas dispersion nozzle 40 made of quartz glass that penetrates a lower part of a side wall of the process chamber 4 inward, is bent, and extends upward. The gas dispersion nozzle 40 includes a plurality of gas ejection holes 40A (also see FIG. 2) formed along the lengthwise direction at predetermined intervals, and the plurality of gas ejection holes 38A approximately uniformly ejects a TEMAZ gas in the horizontal direction.

Similarly, the gas supply part 32 also includes a gas dispersion nozzle 42 made of quartz glass that penetrates a lower part of a side wall of the process chamber 4 inward, is bent, and extends upward. The gas dispersion nozzle 42 includes a plurality of gas ejection holes 42A (also see FIG. 2) formed along the lengthwise direction at predetermined intervals, and the plurality of gas ejection holes 42A approximately uniformly ejects a TMA gas in the horizontal direction.

The purge gas supply part 34 includes a gas dispersion nozzle 44 made of quartz glass that penetrates a lower part of a side wall of the process chamber 4 inward, is bent, and extends upward. The gas dispersion nozzle 44 includes a plurality of gas ejection holes 44A (also see FIG. 2) formed along the lengthwise direction at predetermined intervals, and the plurality of gas ejection holes 44A approximately uniformly ejects an $N_2$ gas as the purge gas in the horizontal direction.

Here, in FIG. 1, although each of the nozzles 38, 40, 42 and 44 penetrates the lower part of the side wall of the process chamber 4 for convenience of depiction, actually, the nozzles 38, 40, 42 and 44 are inserted from the flange part 8.

Furthermore, the nozzles 38, 40, 42 and 44 are connected to corresponding gas passages 48, 50, 52 and 54. The gas passage 48 is connected to an oxygen gas supply source that is used as one of utility facilities for a clean room in which the film deposition apparatus 2 is disposed, and the gas passage 54 is connected to a nitrogen gas source that is used as one of the utility facilities.

The gas passage 50 is connected to a TEMAZ gas supply source (which is not shown in the drawing). The TEMAZ gas supply source includes, for example, a bubbler tank and a carrier gas supply pipe to supply a carrier gas (e.g., $N_2$ gas) to the bubbler tank. When the $N_2$ gas is supplied from the carrier gas supply pipe into the bubbler tank, vapor of the TEMAZ gas is incorporated into the carrier gas, and the carrier gas containing the TEMAZ gas (which is called a TEMAZ gas for convenience) is supplied to the gas passage 50.

In addition, the gas passage 52 is connected to a TMA gas supply source (which is not shown in the drawing). The TMA gas supply source includes, for example, a bubbler tank and a carrier gas supply pipe to supply a carrier gas (e.g., $N_2$ gas) to the bubbler tank. When the $N_2$ gas is supplied from the carrier gas supply pipe into the bubbler tank, vapor of the TMA gas is incorporated into the carrier gas, and the carrier gas containing the TMA gas (which is called TMA gas for convenience) is supplied to the gas passage 52.

Moreover, the respective gas passages 48, 50, 52 and 54 include corresponding on-off valves 48A, 50A, 52A and 54A and corresponding flow controller 48B, 50B, 52B and 54B. By using these, the $O_2$ gas, the TEMAZ gas, the TMA gas and the $N_2$ gas are supplied to the process chamber 4, being controlled at predetermined flow rates.

On the other hand, a plasma generating part 66 is formed in a part of the side wall of the process chamber 4, and a long and narrow exhaust slot 68 is formed as an exhaust port to evacuate the process chamber 4 on the opposite side of the plasma generating part 66 of the process chamber 4.

More specifically, the plasma generating part 66 is formed by hermetically welding and connecting a vertically long and thin plasma zone wall 72 made of, for example, quartz and having a concave shape in cross-section, to the outer wall of the process chamber 4, so as to cover a vertically long and narrow opening 70 from outside. A space zoned by the plasma zone wall 72 (inner space) is integrally communicated with the inside of the process chamber 4. The opening 70 is formed vertically long enough to be able to cover all the wafers W held in the wafer boat 12 in a height direction. Here, providing a slit plate including many slits at a location of the opening 70 is possible.

Moreover, on the outer side surface of both side walls of the plasma zone wall 72, a pair of long and thin plasma electrodes 74 is provided along the lengthwise direction (i.e., vertical direction) so as to face to each other. The plasma electrodes 74 are connected to a radio frequency power source 76 through a feed line 78, and by applying radio frequency voltage of, for example, 13.56 MHz to the pair of plasma electrodes 74, plasma can be generated in the inner space of the plasma zone wall 72. Here, a frequency of the high frequency voltage is not limited to 13.56 MHz, and another frequency, for example, 400 MHz and the like, is possible.

Furthermore, the gas dispersion nozzle 38 extending upward in the process chamber 4 is bent outward in a radial direction of the process chamber 4 on the way, is located at the innermost location (i.e, at the most remote part from the center of the process chamber 4), and stands upward along an inner surface of the plasma zone wall 72. Accordingly, the $O_2$ gas jetted from gas jet holes 38A of the gas dispersion nozzle 38 while the radio frequency power source 76 is activated in the inner space of the plasma zone wall 72, and flows and disperses toward the center of the process chamber 4.

An insulating protective cover 80, for example, made of quartz, is attached to the outside of the plasma zone wall 72 to cover thereof. A cooling medium passage (which is not shown in the drawing) is provided on the inner part of the insulating protective cover 80, and can cool the plasma electrodes 74 by allowing a cooled nitrogen gas or cooling water to be flown therein.

An exhaust slot cover member 82 made of quartz and formed into an approximate L letter shape in cross-section is attached to the exhaust slot 68 facing the opening 70 by welding. The exhaust slot cover 82 extends downward along the side wall of the process chamber 4, and the inside of the process chamber 4 is evacuated by an exhaust device 90 including a pressure regulating valve 86 and a vacuum pump 88.

In addition, a heating part 92 formed into a cylindrical body is provided to heat the process chamber 4 and the wafer W therein so as to surround the outside of the process chamber 4. Moreover, the film deposition apparatus 2 is controlled by a control part 93, for example, constituted of a computer and the like. More specifically, the control part 93 controls a start and a stop of supplying each gas, an instruction of each gas flow rate, an instruction of a process pressure and a process temperature, an on/off of the radio frequency power source 76 and the like. The control part 93 includes a storage medium 94 storing a program readable for a computer to perform the control. The storage medium 94 may include a flexible disc, a CD (Compact Disc), a CD-ROM (Compact Disc-Read Only Memory), a hard disc, a flash memory, a DVD (Digital Versatile Disc) or the like.

<Film Deposition Method>

Next, with reference to FIGS. 1 through 3, a description is given below of a film deposition method of an embodiment of the present invention by taking a case of being performed by the above-mentioned film deposition apparatus as an example. First, for example, the wafer boat 12 (see FIG. 1) loading fifty to one hundred wafers W having a diameter of 300 mm, is carried into the process chamber 4 set at a predetermined temperature from the bottom, and the lower end opening portion is closed by the cover part 18. Subsequently, the purge gas supply part 34 supplies an $N_2$ gas into the process chamber 4, and the inside of the process chamber 4 is kept at a predetermined process pressure by the pressure regulating valve 86 and the vacuum pump 88. Furthermore, the wafers W are kept at a predetermined process temperature by increasing supply power to the heating part 92.

Next, in step S1 (see FIG. 3), by opening the on-off valve 50A of the gas supply part 30, a TEMAZ gas is supplied to the process chamber 4, and the wafers W loaded on the wafer boat 12 are exposed to the TEMAZ gas. By doing this, the TEMAZ gas (molecule) is adsorbed on a surface of the wafers W.

After a lapse of predetermined time period, the supply of the TEMAZ gas into the process chamber 4 is stopped by closing the on-off valve 50A of the gas supply part 30, by which the inside of the process chamber 4 is purged by the $N_2$ gas from the purge gas supply part 34.

After the inside of the process chamber 4 is purged sufficiently, an $O_2$ gas is supplied into the process chamber 4 by opening the on-off valve 48A of the gas supply part 28, and plasma is generated in the inner space of the plasma zone wall 72 by applying radio frequency power to the plasma electrodes 74 from the radio frequency power source 76 (see FIG. 1). By doing this, an activated $O_2$ gas (i.e., oxidation gas) is supplied into the process chamber 4, and the wafers W are exposed to the oxidation gas (step S2, see FIG. 3). At this time, the TEMAZ gas adsorbed on the surfaces of the wafers W is oxidized by the activated $O_2$ gas, and ZrO films are deposited on the wafers W. After the TEMAZ gas on the surfaces of the wafers W are sufficiently oxidized, by closing the on-off valve 48A of the gas supply part 28, the supply of the $O_2$ gas into the process chamber 4 is stopped.

When a cycle of steps S1 and S2 is not performed predetermined times (step S3: NO), the process returns to step S1, steps S1 and S2 are repeated. On the other hand, when this cycle is performed predetermined times, and the ZrO films having a predetermined film thickness (which is hereinafter called a first ZrO film) is deposited (step S3: YES), the process advances to step S4. More specifically, a TEMAZ gas is supplied to the process chamber 4 by opening the on-off valve 50A of the gas supply part 30, and the wafers W loaded on the wafer boat 12 are exposed to the TEMAZ gas. This causes the TEMAZ gas to be adsorbed on the first ZrO films deposited at the predetermined thickness.

After a lapse of a predetermined time period, the supply of the TEMAZ gas to the process chamber 4 is stopped by closing the on-off valve 50A of the gas supply part 30, by which the inside of the process chamber 4 is purged by the $N_2$ gas from the purge gas supply part 34.

Figure 3:
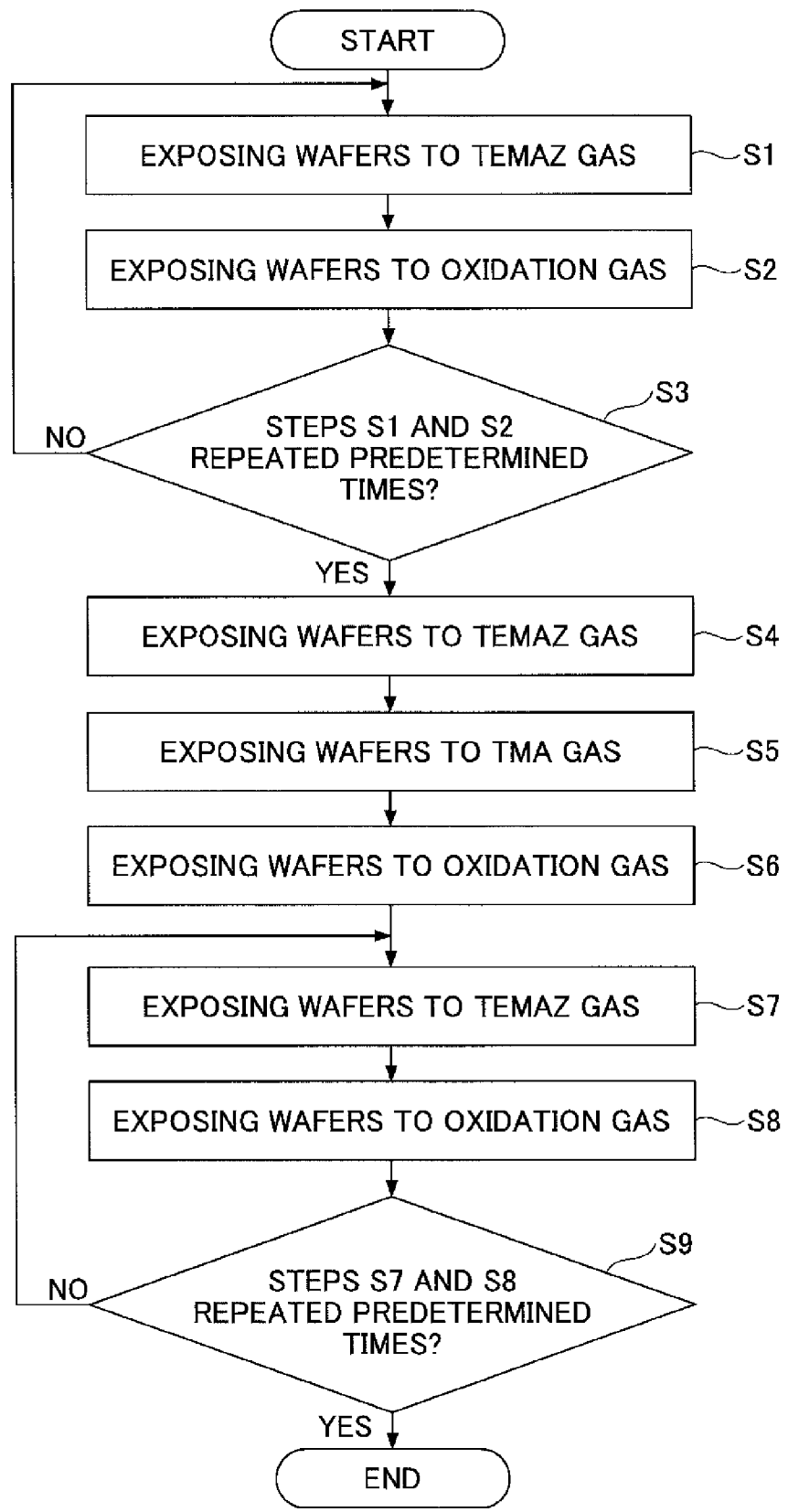
FIG. 3 is a flowchart showing a film deposition method of an embodiment of the present invention.

Next, a TMA gas is supplied to the process chamber 4 by opening the on-off valve 52A of the gas supply part 32, and the wafers W loaded on the wafer boar 12 are exposed to the TMA gas (step S5, see FIG. 3). At this time, because the wafers W have been exposed to the TEMAZ gas in step S4, the TEMAZ gas is also adsorbed on the surfaces of the wafers W (the first ZrO films). The TEMAZ gas is physically adsorbed on the first ZrO films of an underlying film, and is not thought to be stably adsorbed. Because of this, a certain degree of amount of TEMAZ gas is thought to be released from the surfaces of the first ZrO films. At this time, if the wafers W are exposed to the TMA gas, both of the TEMAZ gas and the TMA gas are deposited on the surfaces of the first ZrO films at a predetermined ratio. In other words, the adsorption of the TMA gas is hindered by the adsorbed TEMAZ gas (i.e., the TMA gas is deprived of an adsorption site by the TEMAZ gas), the TMA gas and the TEMAZ gas are adsorbed on the surfaces of the first ZrO films at the predetermined ratio.

Next, after a lapse of a predetermined time period, the supply of the TMA gas to the process chamber 4 is stopped by closing the on-off valve 52A, by which the inside of the process chamber 4 is purged by the $N_2$ gas from the purge gas supply part 34.

After the inside of the process chamber 4 is sufficiently purged, an $O_2$ gas is supplied to the process chamber 4 by opening the on-off valve 48A of the gas supply part 28, and the plasma is generated in the inner space of the plasma zone wall 72 by applying the radio frequency power to the plasma electrodes 74 from the radio frequency power source 76 (see FIG. 1). By doing this, the activated $O_2$ gas (i.e., oxidation gas) is supplied into the process chamber 4, and the wafers W are exposed to the oxidation gas (step S6, see FIG. 3). At this time, the TEMAZ gas and the TMA gas adsorbed on the surfaces of the first ZrO films are oxidized by the activated $O_2$ gas, and ZrAlO films are deposited on the wafers W. After a lapse of a predetermined time period, by closing the on-off valve 48A of the gas supply part 28, the supply of the $O_2$ gas into the process chamber 4 is stopped, and the inside of the process chamber 4 is purged by the $N_2$ gas.

Subsequently, steps S7 through S9 (see FIG. 3) are carried out. These steps correspond to steps S1 through S3, and by performing steps S7 through S9, a ZrO films (which are called second ZrO films) having a predetermined film thickness are deposited on the ZrAlO films. Then, after the inside of the process chamber 4 is purged by the $N_2$ gas, the wafer boat 12 is carried out of the process chamber 4.

As described above, in the film deposition method of the present embodiment, after the first ZrO film having the predetermined film thickness is deposited by repeating steps S1 and S2 the predetermined times, and the ZrAlO film is deposited on the first ZrO film by repeating steps S4 to S6, the second ZrO film having the predetermined film thickness is deposited on the ZrAlO film by repeating steps S7 and S8 the predetermined times. By doing this, the ZrAlO film can be obtained as a whole. Here, if an AlO film is deposited between the first ZrO film and the second ZrO film instead of the ZrAlO film, a total composition ratio of Al to Zr in the ZrAlO film is determined by a ratio of the number of the AlO film to the number of the ZrO film. Accordingly, only a discrete ratio such as 1 to 2, 1 to 3, 1 to 4 . . . and the like can be taken. However, according to the present embodiment, because the ZrAlO film is deposited between the first ZrO film and the second ZrO film, the total composition of the Al in the ZrAlO film can be controlled by using continuous values.

Next, a description is given below of another film deposition apparatus preferable to implement the above film deposition method.

Figure 4:
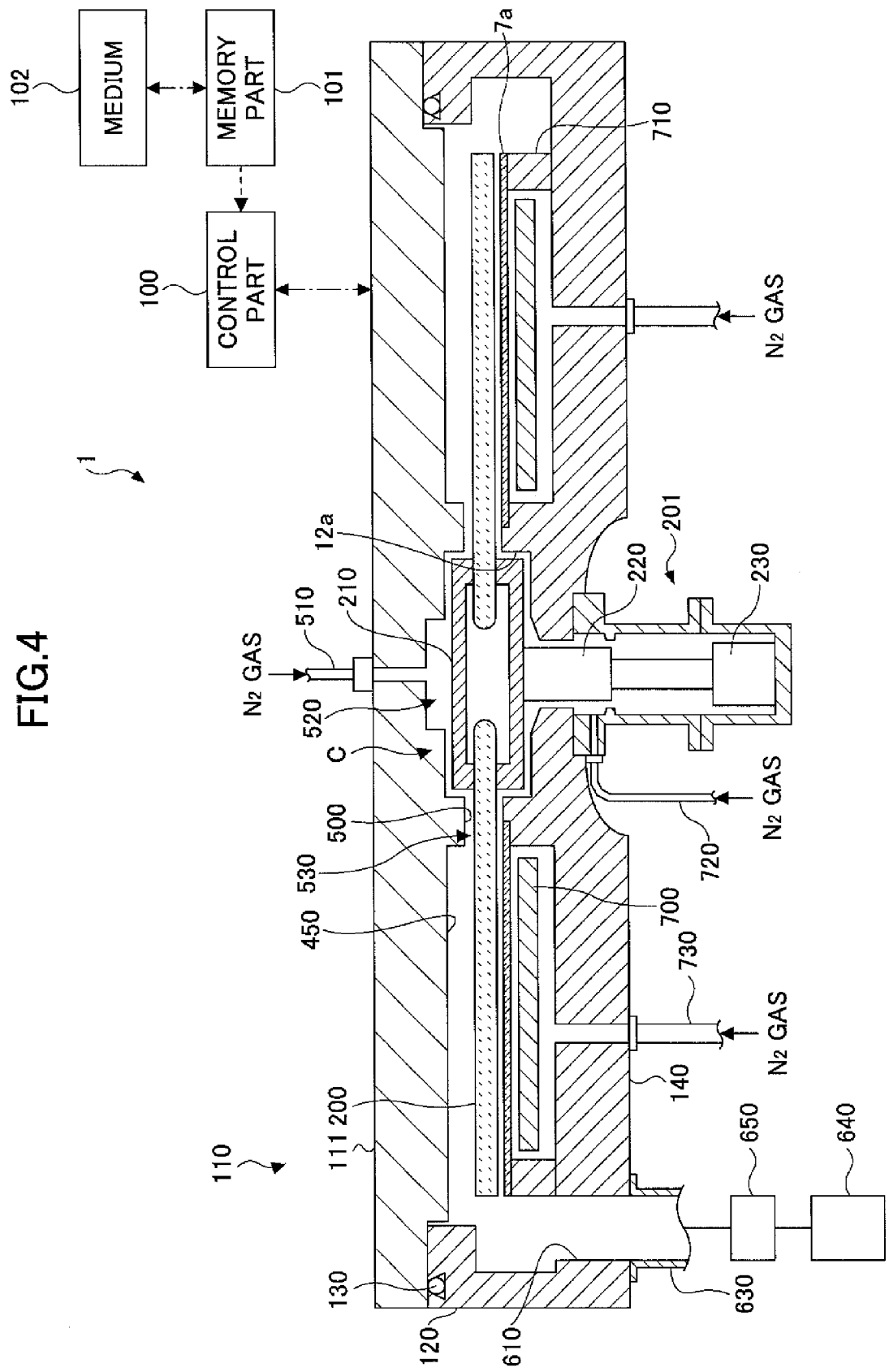
FIG. 4 is a schematic side view illustrating another film deposition apparatus to implement the film deposition of an embodiment of the present invention.
Figure 5:
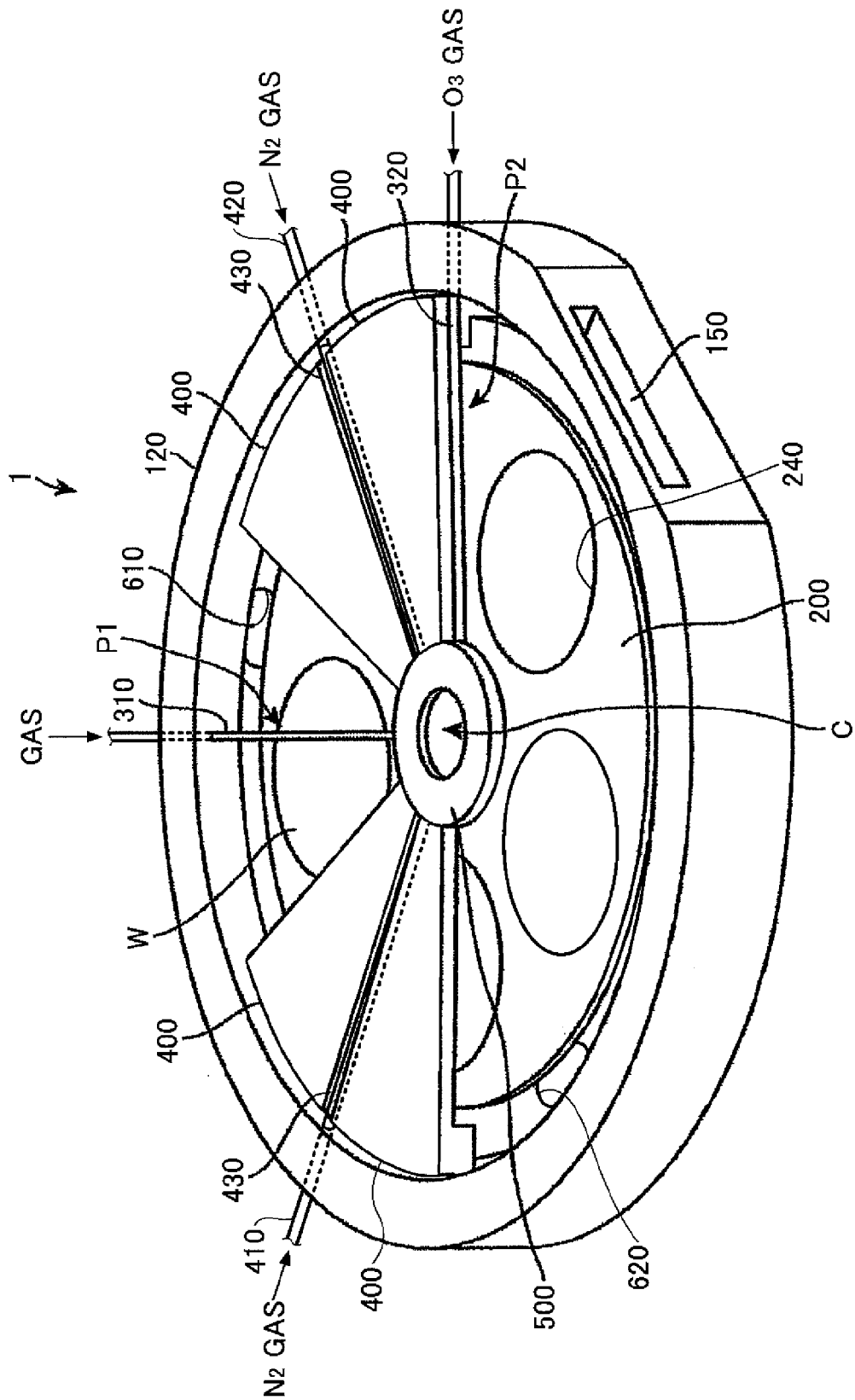
FIG. 5 is a perspective view illustrating a structure in a vacuum chamber of the film deposition apparatus in FIG. 4.
Figure 6:
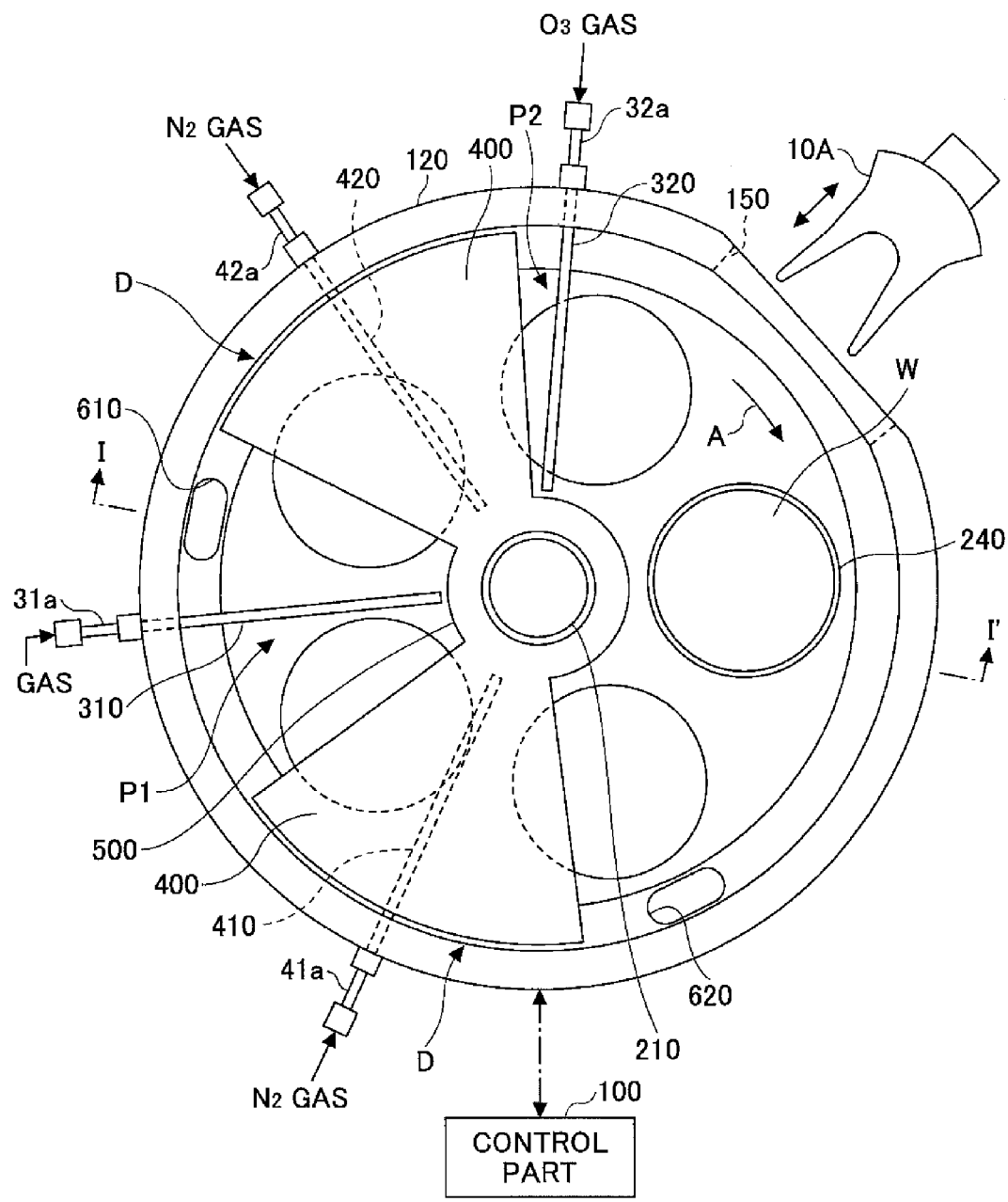
FIG. 6 is a schematic top view illustrating a structure of the vacuum chamber of the film deposition apparatus in FIG. 4.

FIG. 4 is a schematic cross-sectional view of the film deposition apparatus, and FIGS. 5 and 6 are views for explaining structures in a vacuum chamber 110. In FIGS. 5 and 6, depicting a ceiling plate 111 is omitted for convenience of explanation.

With reference to FIGS. 4 through 6, the film deposition apparatus includes a vacuum chamber 110 whose planar shape is an approximately round shape, and a turntable 200 provided in the vacuum chamber 110 and having a center of the rotation that coincides with the center of the vacuum chamber 110. The vacuum chamber 110 includes a chamber body 120 having a cylindrical shape with a bottom, and a ceiling plate 111 hermetically arranged on an upper surface of the chamber body 120 to be attachable to or detachable from the chamber body 120 through a seal member 130 (see FIG. 4) such as an O-ring.

The turntable 200 is fixed to a core portion 210 having a cylindrical shape at the center portion, and the core portion 210 is fixed to an upper end of a rotational shaft 220 that extends in a vertical direction. The rotational shaft 220 penetrates through a bottom part 140 of the vacuum chamber 110, and the lower end is attached to a drive part 230 that rotates the rotational shaft 220 (see FIG. 1) around the vertical axis. The rotational shaft 220 and the drive part 230 are housed in a cylindrical case body 201 whose upper surface is open. A flange part provided on the upper surface of this case body 201 is hermetically attached to the lower surface of a bottom part 140 of the vacuum chamber 110, by which the internal atmosphere of the case body 201 is separated from the external atmosphere.

As illustrated in FIGS. 5 and 6, a plurality of circular shaped wafer receiving portions 240 is provided to allow a plurality of (five in an example of FIG. 6) semiconductor wafers (which is hereinafter called "a wafer or wafers") to be disposed along a rotational direction (i.e., a circumferential direction) W. In FIG. 6, the wafer W is shown in a single wafer receiving portion 240 for convenience. This wafer receiving portion 24 has an inner diameter that is slightly greater, for example, 4 mm, than a diameter of the wafer W (e.g., 300 mm), and a depth approximately equal to a thickness of the wafer. Accordingly, when the wafer W is placed on the wafer receiving portion 240, the surface of the wafer W and the surface of the turntable 200 (which means an area where the wafer is not placed) have the approximately same height.

As illustrated in FIGS. 5 and 6, above the turntable 200, a reaction gas nozzle 310, a separation gas nozzle 420, a reaction gas nozzle 320, and a separation gas nozzle 410 are arranged at intervals in a circumferential direction of the vacuum chamber 1 in this order. These nozzles 310, 320, 410 and 420 are introduced into the vacuum chamber 110 from an external wall by fixing gas introduction ports 31a, 32a, 41a and 42a that are base end portions of the respective nozzles 31, 32, 41 and 42 to the external wall of the chamber body 120 (see FIG. 6), and are installed to extend along a radial direction of the chamber body 120 and parallel to the turntable 200. The reaction gas nozzles 310 and 320 include a plurality of gas discharge holes 330 that are open downward facing the turntable 200 (see FIG. 7) and are arranged along lengthwise directions of the reaction gas nozzles 31 and 32 at intervals of, for example, 10 mm.

The reaction gas nozzle 310 is connected to a TEMAZ gas supply source and a TMA gas supply source (both of which are not shown in the drawing), through a three-way valve and a flow controller (both of which are not shown in the drawing), and the TEMAZ gas and the TMA gas are selectively supplied to the vacuum chamber 110 through a reaction gas nozzle 310 by switching the three-way valve. The reaction gas nozzle 320 is connected to an ozone gas supply source (which is not shown in the drawing), through an on-off valve and a flow controller (both of which are not shown in the drawing), and the ozone gas is supplied to the vacuum chamber 110 through the reaction gas nozzle 320. Here, an area under the reaction gas nozzle 310 may be called a first process area P1 to selectively adsorb the TEMAZ gas and the TMA gas on the wafer W. An area under the reaction gas nozzle 320 may be called a second process area P2 to oxidize the TEMAZ gas and/or the TMA gas adsorbed on the wafer W in the first process area P1.

Moreover, the separation gas nozzles 410 and 420 include a plurality of gas discharge holes 42h that are open downward facing the turntable 2 (see FIG. 7) and are arranged along lengthwise directions of the separation gas nozzles 41 and 42 at intervals of, for example, 10 mm. Furthermore, the separation gas nozzle 410 and 420 are connected to a source of an inert gas such as a noble gas including Ar or He or the like, or an $N_2$ gas, through an on-off valve and a flow controller (both of which are not shown in the drawing). In the present embodiment, the $N_2$ gas is used as the inert gas.

With reference to FIGS. 5 and 6 again, two convex portions 400 are provided in the vacuum chamber 110. The convex portions 400 have an approximately sectorial planar shape whose apex is cut in an arc-like form. In the present embodiment, the inner arc is coupled to a protrusion portion 500 (which is described below), and the outer arc is arranged so as to be along an inner periphery of the chamber body 120 of the vacuum chamber 110. As will be noted from FIG. 7 showing a cross-sectional view of the vacuum chamber 110 along a virtual line concentric with the turntable 200, the convex portion 400 is attached to the back surface of the ceiling plate 111. Because of this, the low ceiling surface 440 (i.e., second ceiling surface) that is a lower surface of the convex portion 400, and the high ceiling surface 45 (i.e., first ceiling surface) higher than the ceiling surface 440 are provided in the vacuum chamber 110. In the following description, a narrow space between the low ceiling surface 440 and the turntable 200 may be called a separation space H. Furthermore, a space between the high ceiling surface 45 and the turntable 200 includes a space 481 including the reaction gas nozzle 310, and a space 482 including the reaction gas nozzle 320.

In addition, as shown in FIG. 7, a groove 430 is formed in the convex portion 400 at the center in the circumferential direction, and the groove portion 430 extends along the radial direction of the turntable 200. The groove portion 430 houses the separation gas nozzle 420. The groove portion 430 is also formed in the other convex portion 400 in a similar way, and the separation gas nozzle 41 is housed therein. When the separation gas nozzle 420 supplies an $N_2$ gas, the $N_2$ gas flows to the spaces 481 and 482 through the separation space H. At this time, because a volume of the separation space is smaller than that of the spaces 481 and 482, a pressure of the separation space H can be higher than that of the spaces 481 and 482 by the $N_2$ gas. In other words, the separation space H provides a pressure barrier between the spaces 481 and 482. Furthermore, the $N_2$ gas flowing from the separation space H to the spaces 481 and 482 is supplied to the first process area P1 and the second process area P2, and works as a counter flow against the TEMAZ gas and/or the TMA gas flowing toward the convex portion 4 from the first process area P1 and the $O_3$ gas flowing toward the convex portion 400 from the second process area P2. Accordingly, the TEMAZ gas and/or the TMA gas of the first process area P1 and the $O_3$ gas of the second process area P2 can be reliably separated by the separation space H. Hence, a mixture and a reaction of the TEMAZ gas and/or the TMA gas and the $O_3$ gas in the vacuum chamber 110 are reduced.

Here, a height h1 of the ceiling surface 440 relative to the upper surface of the turntable 200 is preferably set at an appropriate height to make the pressure of the separate space H higher than the pressure of the spaces 481 and 482, considering the pressure in the vacuum chamber 110, a rotational speed of the turntable 200, and a supply amount of the separation gas (i.e., $N_2$ gas) to be supplied.

With reference to FIGS. 4 through 6 again, a protrusion portion 500 is provided on the lower surface of the ceiling plate 111 so as to surround an outer circumference of the core portion 21 that fixes the turntable 200. In the present embodiment, this protrusion portion 500 continuously extends to a region on the rotational center side of the convex portion 400, and the lower surface of the protrusion portion 5 is formed to be the same height as the ceiling surface 440.

Moreover, as shown in FIG. 6, a first evacuation opening 610 in communication with the space 481 and a second evacuation opening 620 in communication with the space 482 are formed between the turntable 200 and the inner periphery of the chamber body 120. As shown in FIG. 4, the first evacuation opening 610 and the second evacuation opening 620 are connected to, for example, vacuum pumps 640 of a evacuation unit through respective evacuation pipes 630. FIG. 4 also shows a pressure controller 650.

As illustrated in FIG. 4, a heater unit 700 is provided in a space between the turntable 200 and the bottom part 140 of the vacuum chamber 110, and the wafer W on the turntable 200 is heated up to a temperature determined by a process recipe (e.g., 450 degrees) through the turntable 2. A ring-shaped cover member 710 is provided on the lower side of the periphery of the turntable 200 to prevent a gas from intruding into a space under the turntable 200.

As shown in FIG. 4, the bottom part 140 in a region closer to the rotational center than the space where the heater unit 7 is arranged forms a protrusion part 12a so as to get closer to the core portion 210 in the center portion of the lower surface of the turntable 200. A gap between the protrusion part 12a and the core portion 210 forms a narrow space. Moreover, a gap between an inner periphery of a through-hole of the rotational shaft 220 that penetrates through the bottom part 140 and the rotational shaft 220 is narrow, and the narrow space is in communication with the case body 201. The case body 201 includes a purge gas supply pipe 720 to supply the $N_2$ gas as a purge gas to the narrow space for purging the narrow space. Furthermore, a plurality of purge gas supply pipes 730 is provided at predetermined angular intervals in the circumferential direction under the heater unit 700 to purge the arrangement space of the heater unit 700. In addition, a lid member 7a that covers from the cover member 710 (i.e., the upper surface of the cover member 710) to the upper end of the protrusion part 12a throughout the circumferential direction is provided between the heater unit 700 and the turntable 200 to prevent the gas from entering the area including the heater unit 700. The lid member 7a can be made of, for example, quartz.

When the purge gas supply pipe 720 supplies an $N_2$ gas, this $N_2$ gas flows through the gap between the inner periphery of the through-hole and the rotational shaft 220, the gap between the protrusion part 12a and the core portion 210 and the space between the turntable 200 and the lid member 7a, and is evacuated from the first evacuation opening 610 or the second evacuation opening 620 (see FIG. 6). Moreover, when each of the purge gas supply pipes 730 supplies an $N_2$ gas, the $N_2$ gas flows out of the space including the heater unit 700 through a gap between the lid member 7a and the cover member 710 (not shown in the drawing), and is evacuated from the first evacuation opening 610 or the second evacuation opening 620 (see FIG. 6). The flows of the $N_2$ gas can prevent the gases in the space 481 and 482 from being mixed through the space around the center and on the lower side of the vacuum chamber 110, and through the space under the turntable 200.

Furthermore, as shown in FIG. 4, a separation gas supply pipe 510 is connected to the central part of the ceiling plate 111 of the vacuum chamber 110, and is configured to supply an $N_2$ gas of the separation gas to a space 520 between the ceiling plate 111 and the core portion 210. The separation gas supplied to the space 520 is discharged toward the outer edge through a narrow space 530 between the protrusion portion 500 and the turntable 200, and along the surface of the turntable 200 on the wafer receiving area side. The space 530 can be maintained at a higher pressure than that of the spaces 481 and 482 by the separation gas. Accordingly, the space 530 serves to prevent the TEMAZ gas and/or the TMA gas supplied to the first process area P1 and the $O_3$ gas supplied to the second process area P2 from being mixed through the center area C. In other words, the space 530 (or the center area C) can function as well as the separation space H (or the separation area D).

In addition, as shown in FIGS. 5 and 6, a transfer opening 150 is formed in the side wall of the vacuum chamber 110 to transfer the wafer W, which is the substrate, between an outer transfer arm 10A (see FIG. 6) and the turntable 200. The transfer opening 150 is configured to be hermetically openable and closeable by a gate valve not shown in FIGS. 5 and 6. Moreover, the wafer W is transferred between the wafer receiving portions 240, which are the wafer receiving areas in the turntable 200, and the transfer arm 10 at a position where one of the concave portions 24 faces the transfer opening 150. Accordingly, lift pins for transfer to lift up the wafer W from the back side by penetrating through the wafer receiving portion 240 and the lifting mechanism (none of which are shown in the drawing) are provided at the position corresponding to the transfer position under the turntable 200.

Moreover, as shown in FIG. 1, a control part 100 constituted of a computer to control operations of the whole apparatus is provided in this film deposition apparatus, and a program to implement a film deposition process described below is stored in a memory of the control part 100. This program is constituted of instructions of step groups to cause the apparatus to implement respective operations of the apparatus, and is installed from a memory part 101 of a storage medium 102 such as a hard disk, a compact disc, a magnetic optical disc, a memory card and a flexible disc into the control part 100.

According to the film deposition apparatus configured as discussed above, the film deposition method of an embodiment of the present invention can be implemented as below. First, a gate valve not shown in the drawings is opened, and a wafer W is transferred into the vacuum chamber 110 through the transfer opening 150 (see FIGS. 5 and 6) by the transfer arm 10A (see FIG. 6), and is placed in the wafer receiving portion 240 of the turntable 200. This transfer is performed by allowing the lift pins not shown in the drawings to lift up and down from the bottom side of the vacuum chamber 110 through the through-holes of the bottom surface of the wafer receiving portion 240 when the wafer receiving portion 240 is stopped at a position opposite to the transfer opening 150. Such a transfer sequence is performed by rotating the turntable 2 intermittently, and the wafers W are each placed in the five wafer receiving portions 240 of the turntable 200.

Next, the gate valve is closed, and the vacuum chamber 110 is evacuated by the vacuum pump 640 up to a maximum reachable degree of vacuum. After that, the separation gas nozzles 410 and 420 supply an $N_2$ gas of the separation gas at a predetermined flow rate, and the separation gas supply pipe 51 and the purge gas supply pipes 72 and 73 also supply an $N_2$ gas of the separation gas at a predetermined flow rate. In response to this, the pressure controller 650 controls the pressure in the vacuum chamber 110 so as to become a preliminarily set process pressure. Next, the wafer W is heated, for example, in a range from 250 to 350 degrees by the heater unit 700, while rotating the turntable 2 in a clockwise fashion at a rotational speed of, for example, 240 rpm.

Subsequently, the process gas nozzle 310 (see FIGS. 5 and 6) supplies a TEMAZ gas, and the process gas nozzle 320 supplies an $O_3$ gas. Here, the TEMAZ gas and the $O_3$ gas are separated by the separation area H (see FIG. 4), and are scarcely mixed with each other in the vacuum chamber 110.

When the wafer W passes through the first process area P1 (i.e., the area under the reaction gas nozzle 310) by rotating the turntable 200 while the TEMAZ gas and the $O_3$ gas are simultaneously supplied, the wafer W is exposed to the TEMAZ gas (step S1, see FIG. 3), and the TEMAZ gas is adsorbed on a surface of the wafer W. When the wafer W passes through the second process area P2 (i.e., the area under the reaction gas nozzle 320), the wafer W is exposed to the $O_3$ gas (step S2, see FIG. 3), and the TEMAZ gas adsorbed on the surface of the wafer W is oxidized by the $O_3$ gas. By doing this, a ZrO film is deposited on the surface of the wafer W.

After that, the turntable 2 is rotated predetermined times until the ZrO film having a desired film thickness is deposited (step S3 in FIG. 3), and a film deposition of a first ZrO film is finished by stopping the supply of the TEMAZ gas and the $O_3$ gas.

Next, the reaction gas nozzle 310 supplies the TEMAZ gas to the vacuum chamber 110 without supplying the ozone gas from the reaction gas nozzle 320 (or supplying an inactive gas such as an $N_2$ gas from the reaction gas nozzle 320 at this time). This causes the wafer W to be exposed to the TEMAZ gas (step S4 in FIG. 3), and the TEMAZ gas is adsorbed on the surface of the wafer W.

Subsequently, the reaction gas nozzle 310 supplies a TMA gas. At this time, the reaction gas nozzle 320 supplies neither the $O_3$ gas nor any other reaction gas. However, the reaction gas nozzle 320 may supply a noble gas such as an Ar gas or a He gas, or an inactive gas such as a nitrogen gas. Here, when the wafer W passes through the first process area P1 by rotating the turntable 200, the TMA gas is adsorbed on the surface of the wafer W (the first ZrO film). As a result, the TEMAZ gas and the TMA gas are adsorbed on the surface of the first ZrO film.

Next, the reaction gas nozzle 310 stops supplying the TMAZ gas, and the reaction gas nozzle 320 supplies the $O_3$ gas to the vacuum chamber 110 (i.e., the second process area P2). Here, when the wafer W reaches the second process area P2, the wafer W is exposed to the $O_3$ gas (step S6 in FIG. 3), and the TEMAZ gas and the TMA gas adsorbed on the surface of the wafer W are oxidized by the $O_3$ gas. Then, when the wafer W passes through the second process area P2 a plurality of times by rotating the turntable 2, almost all of the TEMAZ gas and the TMA gas adsorbed on the surface of the wafer W are oxidized, and a ZrAlO film is deposited on the whole surface of the wafer W (the first ZrO film).

Subsequently, a sequence similar to the above-mentioned sequence of depositing the first ZrO film is performed (i.e., steps S7 through S9), and a second ZrO film is deposited. After that, the supply of the gases to the vacuum chamber 110 is stopped; the rotation of the turntable 200 is stopped; and the wafers W are carried out of the vacuum chamber 110 by a sequence reverse to the sequence of carrying the wafer W into the vacuum chamber 110. By doing this, the film deposition process is finished.

As discussed above, the film deposition method of the embodiments of the present invention is implemented by the above-mentioned film deposition apparatus 1.

As discussed above, the embodiments and working examples of the present invention have been described in detail, it should be understood that various changes, substitutions, and alterations could be made hereto without departing from the spirit and scope of the invention.

For example, after depositing the second ZrO film, the process returns to step S1 (see FIG. 3), depositing the first ZrO film, the ZrAlO film, and the second ZrO film is possible. Furthermore, repeating the process is also possible.

In addition, the $O_3$ gas may be used in the film deposition apparatus 2 instead of the oxygen plasma, and the oxygen plasma may be used in the film deposition apparatus 1 instead of the $O_3$ gas. In this case, for example, the film deposition apparatus 1 may include in the vacuum chamber 110, two electrodes approximately parallel to the turntable 2 and to each other, a radio frequency power source to supply radio frequency power between the two electrodes, and a gas supply part to supply a plasma generating gas containing oxygen between the two electrodes in order to generate plasma by radio frequency waves supplied to the two electrodes from the radio frequency power source. Moreover, arranging a plasma generating source (i.e., remote plasma) between the reaction gas nozzle 320 and the $O_3$ gas supply source, and generating oxygen plasma by the plasma generating source are also possible.

Furthermore, the film deposition method of the embodiments of the present invention is not limited to be applied to a batch-type film deposition apparatus (e.g., the film deposition apparatus 2) or a turntable-type film deposition apparatus (e.g., the film deposition apparatus 1), and for example, can be implemented by a single-substrate-processing film deposition apparatus.

In addition, instead of the TEMAZ, using an organic metal is possible such as TDMAZ (tetrakis(ethylmethylamino)zirconium), TDEAZ (Tetrakis(diethylamino)zirconium), ZTTB (Zirconium(IV)tetra-tert-butoxide), and $Zr(MMP)_4$ (Tetrakis (1-methoxy-2-methyl-2-propoxy)zirconium). Similarly, instead of the TEMAZ, using an organic metal is possible such as TEA (Triethylaluminium), TMA (Tetramethylaluminum), and $Al(MMP)_3$ (Tris(1-methoxy-2-methylpropoxy) aluminum).

Moreover, the film deposition method of the embodiments of the present invention is not limited to depositing the ZrAlO film, but is applicable to depositing a film of other ternary compounds (i.e., a compound containing three different elements). For example, the film deposition method of the embodiments of the present invention can be applied to a film deposition of depositing a nitride or an oxide of any two metals of aluminum (Al), zirconium (Zr), copper (Cu), tantalum (Ta), titanium (Ti), and hafnium (Hf). Furthermore, the film deposition method of the embodiments of the present invention can be applied to a film deposition of depositing a nitride of silicon (Si) and Hf (i.e., SiHfN), an oxide of Si and Al (SiAlO), or a nitride of Si and Al (SiAlN) (Si is included in metal in the present specification).

A source of Si may include dichlorosilane (DCS), tetraethoxysilane (TEOS), tetramethylsilane (TMS), hexachlorodisilane (HCDS), monosilane ($SiH_4$), disilane ($SiH_6$), hexamethyldisilazane (HMDS), trichlorosilane (TCS), disilylamine (DSA), trisilylamine (TSA), bis(tertiary-butylamino)silane (BTBAS), tris(dimethylamino)silane (3DMAS), tetrakis(dimethylamino)silane (4DMAS), tris (ethylmethylamino)silane (TEMASiH), tetrakis(ethylmethylamino)silane (TEMASi), tetrakis(methoxypropoxy)silane ($Si(MMP)_4$).

A source of Cu may include copper(II) hexafluoroacetylacetonate Hydrate ($Cu(hfac)_2$), copper(II) acetylacetonate ($Cu(acac)_2$), copper dipivaloylmethanate ($Cu(dpm)_2$), copper (II)bis-diisobutylmethanate ($Cu(dibm)_2$), copper isobutylpivaloylmethanate ($Cu(ibpm)_2$), copper bis6-ethyl-2,2-dimethyl-3,5-decanedionate ($Cu(edmdd)_2$), hexafluoroacetylacetonato-copper(1) trimethylvinylsilane, (Cu(hfac)TMVS), 1,5-cyclooctadiene-copper(I)-hexylluoroacetylacetonate (Cu(hfac)COD) and the like.

A source of Ta may include tantalum(V) chloride ($TaCl_5$), tantalum(V) fluoride ($TaF_5$), tantalum(V) bromide ($TaBr_5$), tantalum(V) iodide ($TaI_5$), tertiarybutylimido, tris(diethylamino)tantalum ($Ta(NC(CH_3)_3)(N(C_2H_5)_2)_3$ (TBTDET)), tertiaryamylimidotris(dimethylamido)tantalum (Ta(NC $(CH_3)_2C_2H_5)(N(CH_3)_2)_3$) and the like.

A source of Ti may include titanium(IV) chloride ($TiCl_4$), titanium(IV) fluoride ($TaF_4$), titanium(IV) bromide ($TaBr_4$), titanium iodide ($TaI_4$), tetrakis(methylethylamino) titanium (IV) ($Ti[N(C_2H_5CH_3)]_4$ (TEMAT)), tetra(dimethylamino) titanium(IV) ($Ti[N(CH_3)_2]_4$ (TDMAT)), tetrakis(diethylamino)titanium ($Ti[N(C_2H_5)_2]_4$ (TDEAT) and the like.

A source of Hf may include TEH (tetrakis(ethoxy) hafnium), $Zr(OtBt)_4$, HTTB (hafnium(IV) tert-butoxide), TDMAH (tetrakis(diethylamino)hafnium), TDEAH (Tetrakis(diethylamino)hafnium), TEMAH (tetrakis(ethylmethylamino)hafnium), $Hf(MMP)_4$ (tetrakis(methoxymethylpropoxy)hafnium) and the like.

A gas containing water or water vapor ($H_2O$) may be used as an oxygen source as well as $O_2$ and $O_3$. Ammonia ($NH_3$), hydrazine ($H_4N_2$) (including its organic compound) or nitrogen ($N_2$) may be used as a nitrogen source for the above-mentioned nitride. Moreover, the above-mentioned oxygen source and the nitrogen source may be activated by plasma and supplied to the substrate.

Furthermore, the film deposition method of the embodiments of the present invention can be applied not only to a deposition of the ternary compound, but also to a deposition of a quarternary compound.

In addition, the $N_2$ gas is used as the separation gas in the film deposition apparatus 1, and the $N_2$ gas is used as the purge gas in the film deposition apparatus 2, but a noble gas such as He, Ar and the like may be used instead of the $N_2$ gas.

According to the embodiments of the present invention, there is provided an atomic layer (or molecular layer) film deposition method that can improve compound controllability of a metal compound.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention.

What is claimed is:

1. A film deposition method comprising steps of:
    depositing a first metal compound film by performing a first cycle of exposing a substrate to a first source gas containing a first metal, and of exposing the substrate to a reaction gas reactive with the first source gas; and
    depositing a second metal compound film on the first metal compound film by performing a second cycle, said second cycle comprising:
    adsorbing the first source gas on the first metal compound film, which is already deposited on the substrate, by exposing the first metal compound film to the first source gas;
    exposing, after adsorbing the first source gas on the first metal compound film, the first metal compound film to a second source gas containing a second metal in a state in which the first source gas is already adsorbed on the first metal compound film such that the second source gas is adsorbed in addition to the first source gas on the first metal compound film; and
    exposing the substrate, on which the first and the second source gases are adsorbed, to the reaction gas, the reaction gas being reactive also with the second source gas,
    wherein said second source gas causes, upon absorption on the first metal compound film, a part of said first source gas to be released from a surface of the first metal compound film to which the first source gas has been adsorbed.

2. The film deposition method as claimed in claim 1, wherein the step of depositing the first metal compound film is performed again after the step of depositing the second metal compound film is performed.

3. The film deposition method as claimed in claim 1, wherein the step of depositing the first metal compound film and the step of depositing the second metal compound film are repeated in this order.

4. The film deposition method as claimed in claim 1, wherein the first cycle is repeated one or more times in the step of depositing the first metal compound film.

5. The film deposition method as claimed in claim 1, wherein the first metal is zirconium, and the second metal is aluminum.

6. The film deposition method as claimed in claim 1, wherein the first source gas contains an organic metal of zirconium, and the second source gas contains an organic metal of aluminum.

7. The film deposition method as claimed in claim 6, wherein the organic metal of zirconium is a tetrakis(ethylmethylamino)zirconium gas, and the organic metal of aluminum is a trimethylaluminum.

8. The film deposition method as claimed in claim 5, wherein the reaction gas contains oxygen.

* * * * *